US 9,645,176 B2

(12) United States Patent
Sardat et al.

(10) Patent No.: US 9,645,176 B2
(45) Date of Patent: May 9, 2017

(54) DEVICE FOR MEASURING A CHOPPED CURRENT

(71) Applicant: Valeo Systemes de Controle Moteur, Cergy Pontoise (FR)

(72) Inventors: Pierre Sardat, Le Raincy (FR); Maxime Moreau, Saint-Leu-la Foret (FR)

(73) Assignee: Valeo Systemes de Controle Moteur, Cergy Pontoise (FR)

( * ) Notice: Subject to any disclaimer, the term of this patent is extended or adjusted under 35 U.S.C. 154(b) by 160 days.

(21) Appl. No.: 14/571,595

(22) Filed: Dec. 16, 2014

(65) Prior Publication Data
US 2015/0168461 A1 Jun. 18, 2015

(30) Foreign Application Priority Data
Dec. 16, 2013 (FR) ..................... 13 62667

(51) Int. Cl.
*G01R 19/00* (2006.01)
*G01R 15/18* (2006.01)
(Continued)

(52) U.S. Cl.
CPC ....... *G01R 19/0046* (2013.01); *G01R 15/183* (2013.01); *G01R 19/0092* (2013.01);
(Continued)

(58) Field of Classification Search
None
See application file for complete search history.

(56) References Cited

U.S. PATENT DOCUMENTS

| 5,068,776 A | 11/1991 | Polivka |
| 5,610,508 A | 3/1997 | Kammiller |

(Continued)

FOREIGN PATENT DOCUMENTS

| EP | 0631145 A2 | 12/1994 |
| GB | 2143998 A | 2/1985 |
| WO | 03/028198 A1 | 4/2003 |

OTHER PUBLICATIONS

Preliminary Search Report dated Aug. 18, 2014 in corresponding European Patent Application No. 1362667 (11 pages).

*Primary Examiner* — Paresh Patel
(74) *Attorney, Agent, or Firm* — Osha Liang LLP

(57) ABSTRACT

A device for measuring a chopped current capable of flowing in a circuit having an H-bridge structure including a first branch and a second branch is disclosed. The device includes two transformers respectively connected to a branch and each comprising a primary circuit configured for the flow of a chopped current and a secondary circuit, two demagnetizing circuits, and two measuring circuits respectively connected to the terminals of the secondary circuit of an associated transformer, and respectively including at least one unit which comprises two switch connected in reverse, the two switches being respectively implemented by a transistor and being capable of being controlled. The measuring circuits include a common measuring resistor connected via a terminal to the ground, and via another terminal to the source of the first transistor of the first measuring circuit and to the source of the first transistor of the second measuring circuit.

7 Claims, 4 Drawing Sheets

Figure 1:
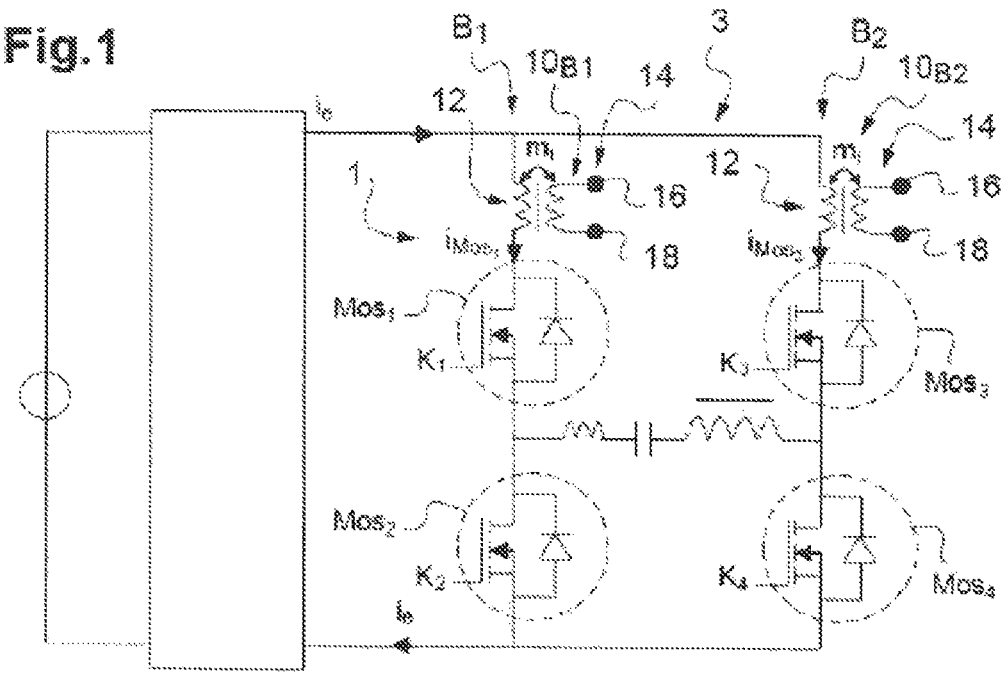

(51) Int. Cl.
*G01R 19/20* (2006.01)
*H02M 3/337* (2006.01)
*H02M 1/00* (2006.01)

(52) U.S. Cl.
CPC ............ *G01R 19/20* (2013.01); *H02M 3/337* (2013.01); *H02M 2001/0009* (2013.01)

(56) References Cited

U.S. PATENT DOCUMENTS

| | | | |
|---|---|---|---|
| 5,815,391 A | 9/1998 | Pelly | |
| 6,121,768 A * | 9/2000 | Taurand | G01R 15/183 324/117 R |
| 6,946,829 B2 * | 9/2005 | Sardat | G01R 19/20 324/117 R |
| 8,125,238 B2 * | 2/2012 | Stenzel | G01R 31/2822 324/762.01 |
| 2005/0012497 A1 * | 1/2005 | Sardat | G01R 19/20 324/127 |
| 2011/0316524 A1 | 12/2011 | Kim et al. | |
| 2012/0127769 A1 | 5/2012 | Kern | |

\* cited by examiner

DEVICE FOR MEASURING A CHOPPED CURRENT

The present invention relates to a device for measuring a chopped current.

Such a measuring device is particularly applicable to measuring a chopped current flowing to the input of a DC-DC converter.

Such a measuring device may comprise a pulse transformer. The transformer comprises a primary circuit in which the chopped current flows, and a secondary circuit in which an output current flows that is proportional to the chopped current. The secondary circuit of the transformer includes two output terminals between which a circuit is connected for measuring the output current. The measuring circuit generally includes a resistor.

Sometimes it is necessary to measure a chopped current with a non-zero average value, e.g. for measuring the chopped current flowing in a DC-DC converter, connecting two power supply batteries of different voltages.

Accordingly, it is necessary to regularly demagnetize the pulse transformer. Indeed, as a first approximation, the imperfections of the pulse transformer can be modelled by a magnetizing inductance arranged between the output terminals of the secondary circuit. The measuring device comprises for this purpose means for demagnetizing the transformer. By way of example, the demagnetization takes place e.g. by passing the magnetizing current through a demagnetizing circuit so that the energy stored in the magnetizing inductance can thus be released.

The current to be measured may also comprise positive, negative or zero instantaneous values. To this end, according to a known solution, the measuring circuit comprises a switch and means for synchronizing this switch with the chopped current, for enabling the output current to flow in the measuring circuit when the chopped current is non-zero (positive or negative) and for preventing any current flow in the measuring circuit when the chopped current is zero.

The switch enables the output current to flow in both directions in the measuring circuit.

The demagnetizing circuit generally includes a Zener diode mounted in series with one diode arranged in the opposite direction to the Zener diode.

The demagnetizing operation is performed during 'freewheel' periods when the chopped current is zero.

The demagnetizing phase is therefore dependent on the freewheel period. However, this period depends on the duty cycle, and may not be long enough to allow the demagnetization of the transformer.

The invention aims to at least partially overcome these drawbacks of the prior art, by providing a device for measuring a chopped current, capable of measuring a bidirectional current, while ensuring a sufficient time for demagnetization.

To this end, the subject matter of the invention is a device for measuring a chopped current capable of flowing in a circuit having an H-bridge structure including a first branch and a second branch, characterized in that it comprises:

two transformers respectively connected to a branch of the H-bridge, the transformers respectively comprising a primary circuit configured for the flow of a chopped current and a secondary circuit, two demagnetizing circuits for the two transformers and two measuring circuits respectively connected to the terminals of the secondary circuit of an associated transformer, the measuring circuits respectively including at least one unit configured for:

allowing the flow of a current induced by the chopped current, in the measuring circuit when the primary circuit of the associated transformer is closed, and preventing the flow of a demagnetizing current in the measuring circuit when the primary circuit current of the associated transformer is open.

Thus, the presence of a transformer in each branch of the H-bridge always enables having half an operating period for demagnetizing the transformer. The demagnetizing time is known which becomes constant and is no longer dependent on the duty cycle.

According to one aspect of the invention, a unit configured for allowing or preventing the flow of a current induced by the chopped current in a measuring circuit comprises a first switch and a second switch connected in reverse, the two switches being capable of being controlled so as to allow the flow of a current induced by the chopped current, in the measuring circuit when the primary circuit of the associated transformer is closed and to prevent the flow of the current in the measuring circuit when the primary circuit of the associated transformer is open.

According to one embodiment, the first switch and the second switch are respectively implemented by a transistor, e.g. a field effect transistor.

According to another aspect of the invention, the measuring circuits include at least one measuring resistor connected via a first terminal to the ground.

According to one example:

the first switch of a measuring circuit comprises a terminal connected to a second terminal of the measuring resistor, the first terminal of the measuring resistor being connected to the ground; and the second switch of a measuring circuit comprises a terminal connected to the ground.

According to a first embodiment, the measuring circuits include a common measuring resistor connected:

via a first terminal to the ground, and via a second terminal to the source of the first transistor of the first measuring circuit and to the source of the first transistor of the second measuring circuit.

According to a second embodiment, the measuring circuits respectively include a measuring resistor connected via a terminal to the ground, the measuring resistor of the first measuring circuit is connected via one of the terminals thereof to the source of the first transistor and to the source of the second transistor of the first measuring circuit via the other of the terminals thereof, and the measuring resistor of the second measuring circuit is connected to the source of the first transistor via one of the terminals thereof and to the source of the second transistor of the second measuring circuit via the other of the terminals thereof.

According to one example of embodiment, the first measuring circuit includes a first output resistor and the second measuring circuit includes a second output resistor, such that the two output resistors are in series. In this case, a measuring voltage can be measured at the common node between the two output resistors.

According to another aspect of the invention:

the branches of the circuit respectively include a first switch and a second switch, the first transformer is connected to the first switch of the first branch and the second transformer is connected to the first switch of the second branch, and the unit of the first measuring circuit configured for allowing or preventing the flow of a current induced by the chopped current in the first measuring circuit is configured for being controlled by the inverse of the control signal of the second switch of the first branch and the unit of the second measuring circuit configured for allowing or preventing the flow of a current induced by the chopped current in the second measuring circuit is configured for being controlled by the inverse of the control signal of the second switch of the second branch.

According to one example of embodiment:

the first measuring circuit comprises a first resistor and a second resistor, the terminal common to the two resistors being connected to the gate of the first transistor and of the second transistor of the first measuring circuit, and the second measuring circuit comprises a first resistor and a second resistor, the terminal common to the two resistors being connected to the gate of the first transistor and of the second transistor of the second measuring circuit.

According to another aspect of the invention, the demagnetizing means respectively comprise a demagnetizing circuit connected between the two output terminals of the secondary circuit of the associated transformer.

A demagnetizing circuit comprises, for example, two Zener diodes mounted in series and in opposite directions.

The invention also relates to a device for measuring a chopped current capable of flowing in a branch of a circuit, characterized in that it comprises:

a transformer connected to said branch, the transformer comprising a primary circuit configured for the flow of the chopped current, and a secondary circuit, a demagnetizing circuit for the transformer, and a measuring circuit connected to the terminals of the secondary circuit of the transformer, the measuring circuit including:

at least one unit comprising a first switch and a second switch connected in reverse, the two switches being capable of being controlled so as to allow the flow of a current induced by the chopped current, in the measuring circuit when the primary circuit of the transformer is closed and to prevent the flow of a demagnetizing current in the measuring circuit when the primary circuit of the transformer is open, and at least one measuring resistor connected via a first terminal to the ground, such that:

the first switch of the measuring circuit comprises a terminal connected to a second terminal of the measuring resistor, and the second switch of the measuring circuit comprises a terminal connected to the ground.

The measuring device may have any one of the previously described features that are compatible therewith, in particular those relating to a transformer, a demagnetizing circuit, and/or a measuring circuit. Particularly, the device may comprise any one of the following features:

the branch of the circuit including a first switch and a second switch, the transformer is connected to the first switch of the branch, and the unit of the measuring circuit configured for allowing or preventing the flow of a current induced by the chopped current in the measuring circuit is configured for being controlled by the inverse of the control signal of the second switch of the branch;

the first switch and the second switch are respectively implemented by a transistor, e.g. a field effect transistor;

the measuring circuit comprises a first resistor and a second resistor, the terminal common to the two resistors being connected to the gate of the first transistor and of the second transistor of the measuring circuit;

the demagnetizing circuit is connected between the two output terminals of the secondary circuit of the transformer;

the demagnetizing circuit comprises two Zener diodes mounted in series and in opposite directions.

The invention also relates to a device for measuring a chopped current capable of flowing in a circuit having an H-bridge structure including a first branch and a second branch, characterized in that it comprises:

two transformers respectively connected to a branch of the H-bridge, the transformers respectively comprising a primary circuit configured for the flow of a chopped current, and a secondary circuit, two circuits for demagnetizing the two transformers, and two measuring circuits respectively connected to the terminals of the secondary circuit of an associated transformer, the measuring circuits respectively including at least one unit which comprises a first switch and a second switch connected in reverse, the two switches being respectively implemented by a transistor and being capable of being controlled so as to:

allow the flow of the current induced by the chopped current, in the measuring circuit when the primary circuit of an associated transformer is closed, and prevent the flow of the demagnetizing current in the measuring circuit when the primary circuit of an associated transformer is open;

the measuring circuits including a common measuring resistor connected via a first terminal to the ground, and via a second terminal to the source of the first transistor of the first measuring circuit and to the source of the first transistor of the second measuring circuit.

The device may have any one of the previously described features that are compatible therewith.

Figure 2:
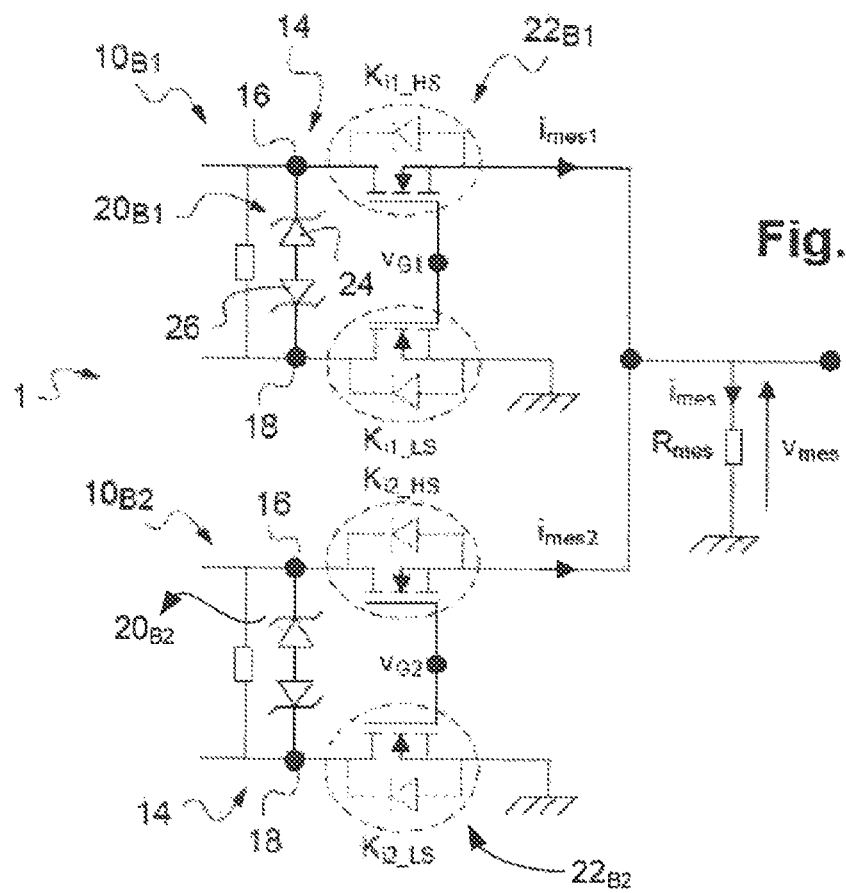
Figure 3:
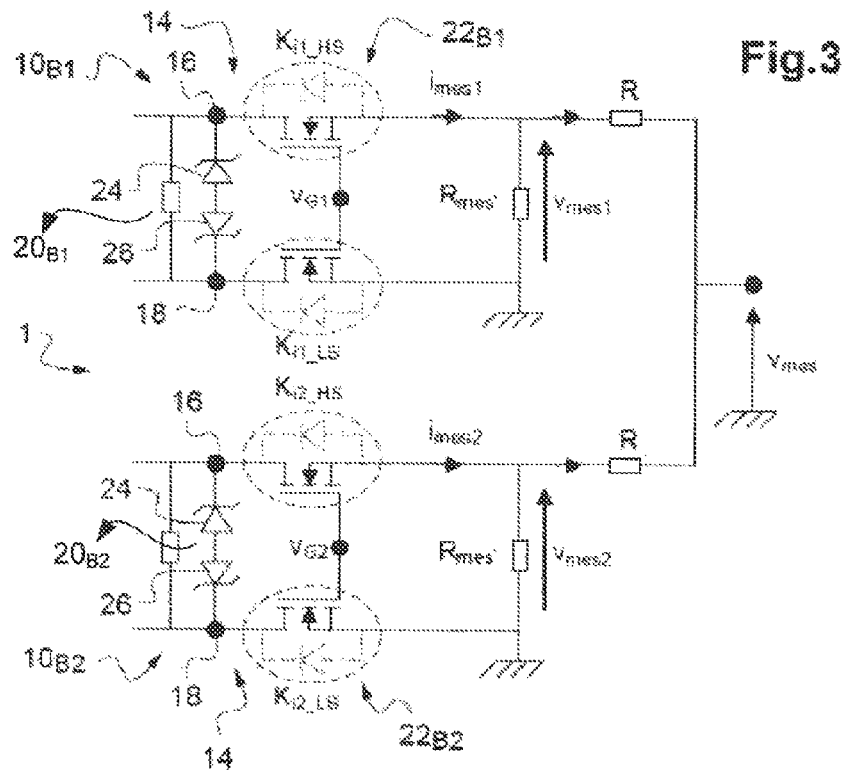
Figure 8:
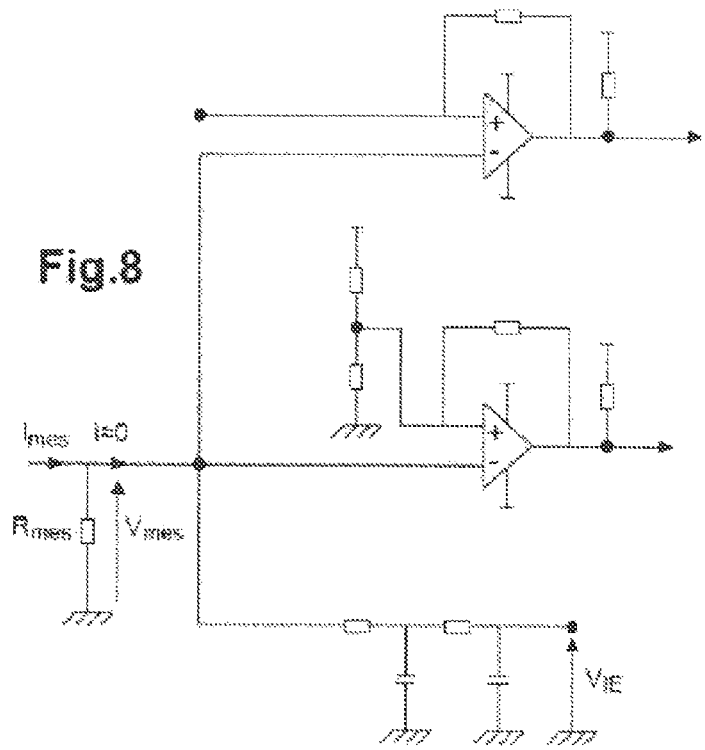
Figure 4:
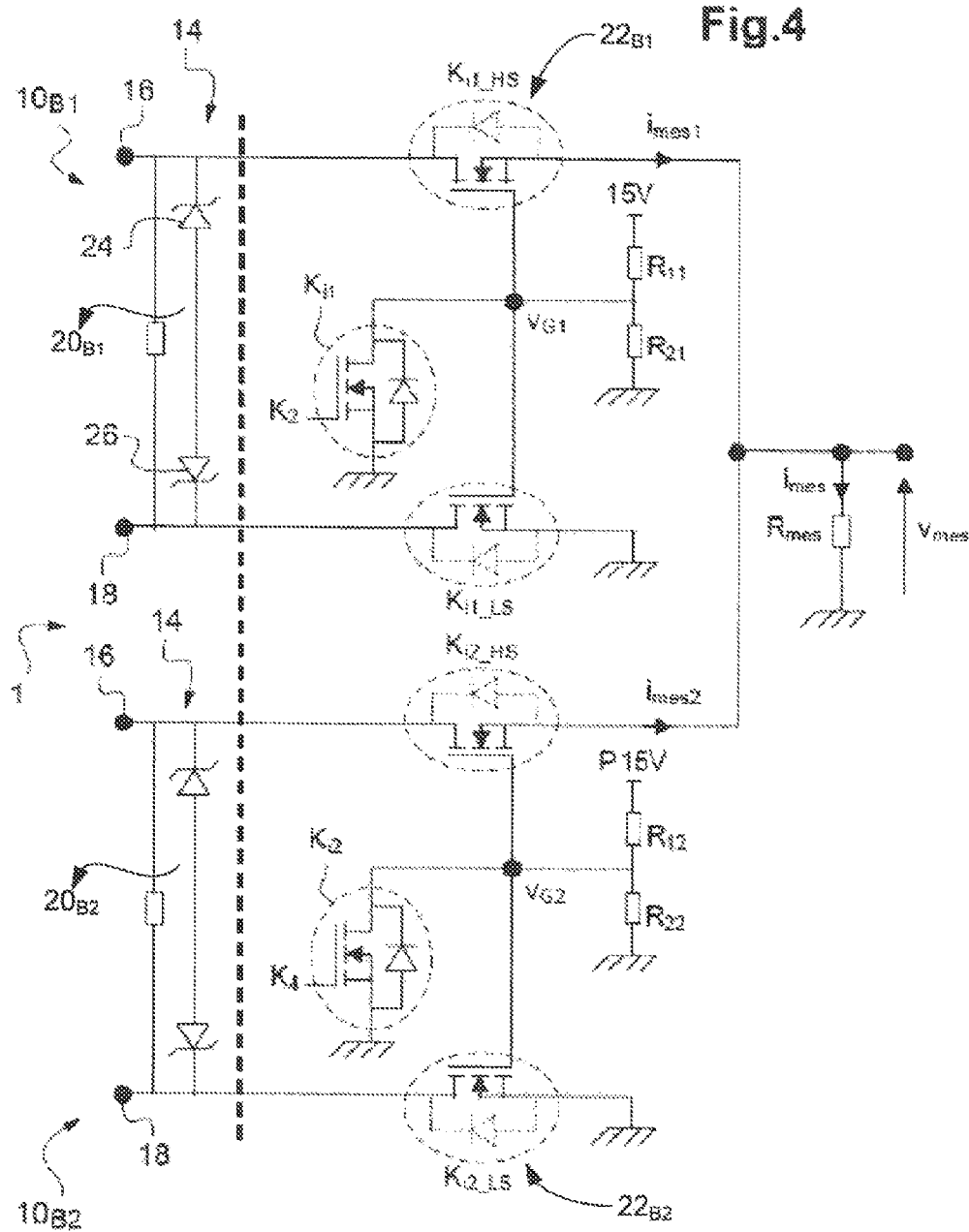
Figure 5:
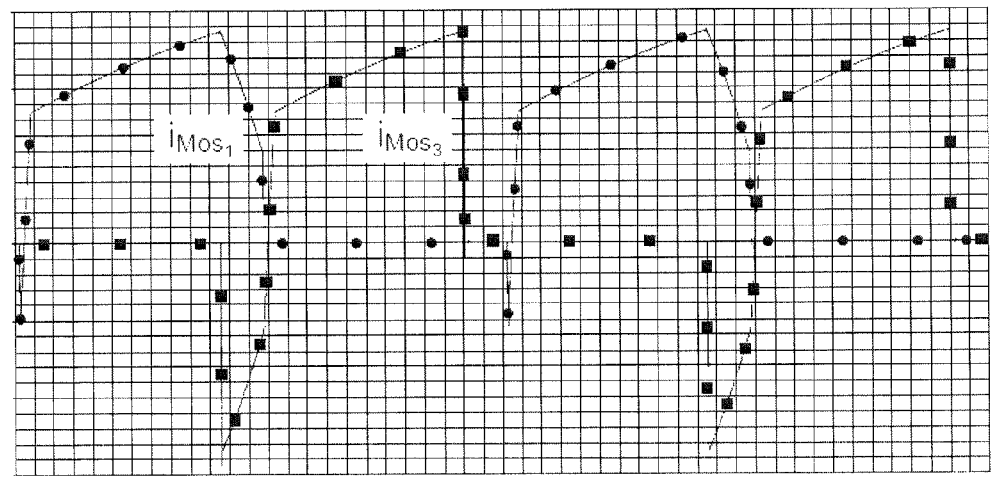
Figure 6:
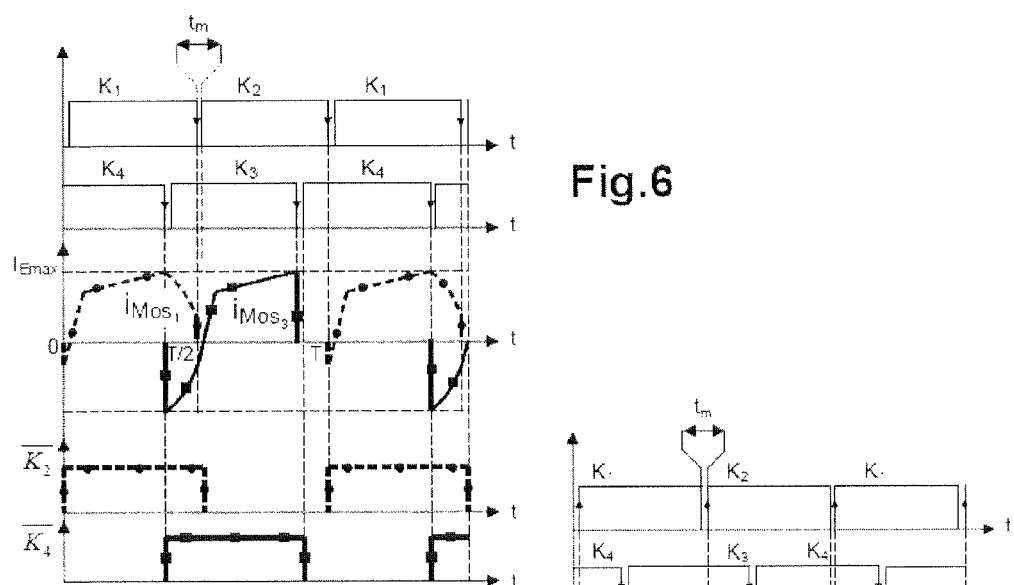
Figure 7:
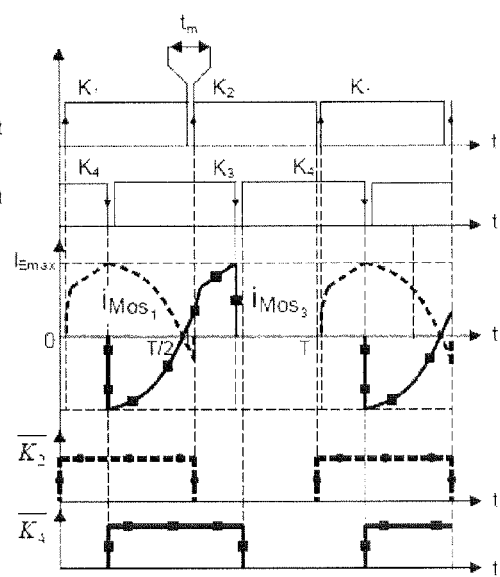

Other features and advantages of the invention will appear more clearly on reading the following description, given as an illustrative and non-restrictive example, and the accompanying drawings in which:

FIG. 1 represents a DC-DC converter circuit through which a chopped current flows including two transformers of a device for measuring the chopped current, FIG. 2 schematically represents two demagnetizing circuits and two measuring circuits of the device for measuring the chopped current according to a first embodiment, FIG. 3 schematically represents two demagnetizing circuits and two measuring circuits of the device for measuring the chopped current according to a second embodiment, FIG. 4 is a more detailed representation of the demagnetizing circuits and measuring circuits of the device for measuring the chopped current in FIG. 2 according to the first embodiment, FIG. 5 is a graph representing the temporal evolution of chopped currents in the primary circuits of two transformers respectively connected to a branch of the H-bridge structured converter, FIG. 6 is a first example of a timing diagram representing the temporal evolution of the chopped currents in FIG. 5, and the pulse signals of the H-bridge branch switches, FIG. 7 is a second example of a timing diagram representing the temporal evolution of chopped currents in the primary circuits of two transformers respectively connected to a branch of the H-bridge structured converter, and the pulse signals of the H-bridge branch switches, and FIG. 8 schematically represents an example of comparators used after measuring an output voltage proportional to the input chopped current.

In these figures, identical elements bear the same references.

The invention relates to a device 1 for measuring a chopped current, in particular flowing inside a DC-DC converter 3.

Converter

Referring to FIG. 1, the converter 3 represented has an H-bridge structure having a first branch $B_1$ and a second branch $B_2$.

The first branch $B_1$ comprises a first switch $Mos_1$ and a second switch $Mos_2$.

The second branch $B_2$ comprises a first switch $Mos_3$ and a second switch $Mos_4$.

The switches $Mos_1$ to $Mos_4$ comprise, by way of a non-restrictive example, an N-type, field effect transistor known under the acronym MOSFET.

When the first branch $B_1$ is controlled, the first switch $Mos_1$ is turned on when the second switch $Mos_1$ is blocked, and conversely the second switch $Mos_1$ is turned on when the first switch $Mos_1$ is blocked.

The same applies to controlling the second branch $B_2$, the first switch $Mos_3$ is turned on when the second switch $Mos_4$ is blocked, and conversely the second switch $Mos_4$ is turned on when the first switch $Mos_3$ is blocked.

The offset between the two branches $B_1$ and $B_2$ depends on the H-bridge control logic.

Device for Measuring the Chopped Current

Referring again to FIG. 1, the device 1 for measuring the chopped current comprises two transformers $10_{B1}$ and $10_{B2}$ with a transformation ratio of $m_t$. The two transformers $10_{B1}$ and $10_{B2}$ are arranged respectively on a branch $B_1$ or $B_2$ of the converter 3.

One transformer $10_{B1}$ or $10_{B2}$ includes a primary circuit 12 and a secondary circuit 14.

The primary circuit 12 of a first transformer $10_{B1}$ is connected to the first switch $Mos_1$ of the first branch $B_1$ of the converter 3. The primary circuit 12 of the second transformer $10_{B2}$ is connected to the first switch $Mos_3$ of the second branch $B_2$ of the converter 3.

The secondary circuit 14 of a transformer $10_{B1}$ or $10_{B2}$ comprises two output terminals 16 and 18.

When a chopped current $i_c$ flows in the converter 3, it is split in the two branches $B_1$ and $B_2$, so that a first chopped current $i_{Mos1}$ flows in the primary circuit 12 of the first transformer $10_{B1}$, and a second chopped current $i_{Mos3}$ flows in the primary circuit 12 of the second transformer $10_{B2}$.

When the primary circuit 12 of the first transformer $10_{B1}$ or of the second transformer $10_{B2}$ is closed, the chopped current $i_{Mos1}$ or $i_{Mos3}$ flowing in the primary circuit 12 of the first transformer $10_{B1}$ or of the second transformer $10_{B2}$ is non-zero, and the associated transformer $10_{B1}$ or $10_{B2}$ is magnetized.

A demagnetization of a transformer $10_{B1}$ or $10_{B2}$ takes place when the primary circuit 12 of the first transformer $10_{B1}$ or of the second transformer $10_{B2}$ is open, the chopped current $i_{Mos1}$ or $i_{Mos3}$ being zero, i.e. when there is no current to be measured.

And in addition, the device 1 can be used to measure the chopped current when the primary circuit 12 of the first transformer $10_{B1}$ or of the second transformer $10_{B2}$ is closed, the chopped current $i_{Mos1}$ or $i_{Mos3}$ flowing in the primary circuit 12 of the first transformer $10_{B1}$ or of the second transformer $10_{B2}$ being non-zero.

For this purpose, with reference to FIG. 2, the measuring device 1 further includes:

two demagnetizing circuits $20_{B1}$, $20_{B2}$ respectively associated with a transformer $10_{B1}$ or $10_{B2}$, and two chopped current measuring circuits $22_{B1}$ and $22_{B2}$ respectively connected to the output terminals 16, 18 of the associated transformer $10_{B1}$ or $10_{B2}$.

According to the described embodiment, the demagnetizing circuits $20_{B1}$, $20_{B2}$ are separate from the measuring circuits $22_{B1}$ and $22_{B2}$.

Each demagnetizing circuit $20_{B1}$ and $20_{B2}$ is connected between the two output terminals 16 and 18 of the associated transformer $10_{B1}$ or $10_{B2}$.

Each demagnetizing circuit $20_{B1}$, $20_{B2}$ enables the demagnetization of the associated transformer $10_{B1}$ or $10_{B2}$ through a flow of a current in the demagnetizing circuit $20_{B1}$ or $20_{B2}$.

According to the embodiment illustrated in FIG. 2, a demagnetizing circuit $20_{B1}$ or $20_{B2}$ includes a first Zener diode 24 connected in series with a second Zener diode 26 between the output terminals 16 and 18. The Zener voltage is by way of an illustrative example of the order of 10 V.

The first Zener diode 24 and the second Zener diode 26 are mounted in opposite directions. As an example, the first Zener diode 24 may be connected via its cathode to the output terminal 16 and the second Zener diode 26 may be connected via its cathode to the other output terminal 18. The two Zener diodes 24 and 26 are then connected with one another via the anodes thereof.

Thus, the demagnetizing circuits $20_{B1}$, $20_{B2}$ are bidirectional, i.e. they enable demagnetization in both directions of flow of the magnetizing current, according to whether the average value of the chopped current is positive or negative.

A first measuring circuit $22_{B1}$ is connected to the output terminals 16, 18 of the secondary circuit 14 of the first transformer $10_{B1}$ connected to the first branch $B_1$ of the converter 3. The first measuring circuit $22_{B1}$ is connected in parallel with the first demagnetizing circuit $20_{B1}$.

A second measuring circuit $22_{B2}$ is connected to the output terminals 16, 18 of the secondary circuit 14 of the second transformer $10_{B2}$ connected to the second branch $B_2$ of the converter 3. The second measuring circuit $22_{B2}$ is connected in parallel with the second demagnetizing circuit $20_{B2}$. The second measuring circuit $22_{B2}$ is further connected to the first measuring circuit $22_{B1}$.

The measuring circuits $22_{B1}$ and $22_{B2}$ respectively include at least one unit configured for:

allowing the flow of a current $i_{mes1}$; $i_{mes2}$ induced by the chopped current, in the measuring circuit $22_{B1}$ or $22_{B2}$, when the primary circuit 12 of a transformer $10_{B1}$; $10_{B2}$ is closed; in this case the chopped current flowing in the primary circuit 12 is non-zero, either strictly positive or strictly negative, and preventing the flow of the demagnetizing current in the measuring circuit $22_{B1}$ or $22_{B2}$ when the primary circuit 12 of a transformer $10_{B1}$; $10_{B2}$ is open; in this case the chopped current flowing in the primary circuit 12 is zero.

According to the embodiment described, the two measuring circuits $22_{B1}$ and $22_{B2}$ respectively include a unit configured for allowing or preventing the flow of a current induced by the chopped current in the associated measuring circuit $22_{B1}$ or $22_{B2}$, and comprising a first switch and a second switch. The unit of the first measuring circuit $22_{B1}$ includes a first switch $K_{i1\_HS}$ and a second switch $K_{i1\_LS}$. The unit of the second measuring circuit $22_{B2}$ includes a first switch $K_{i2\_HS}$ and a second switch $K_{i2\_LS}$.

The first switches $K_{i1\_HS}$ and $K_{i2\_HS}$ are also called High Side switches.

The second switches $K_{i1\_LS}$ and $K_{i2\_LS}$ are also called Low Side switches.

The first and second switches $K_{i1\_HS}$ and $K_{i1\_LS}$ of the first measuring circuit $22_{B1}$ and the first and second switches $K_{i2\_HS}$ and $K_{i2\_LS}$ of the second measuring circuit $22_{B2}$ are formed, according to the example described, of MOSFET field effect transistors.

The first and second switches $K_{i1\_HS}$ and $K_{i1\_LS}$ of the first measuring circuit $22_{B1}$ in this example are connected in reverse. Similarly, the first and second switches $K_{i2\_HS}$ and $K_{i2\_LS}$ of the second measuring circuit $22_{B2}$ are connected in reverse.

Furthermore, with reference to FIGS. 3 and 4, the measuring circuits $22_{B1}$; $22_{B2}$ include at least one measuring resistor $R_{mes}$ or $R_{mes}'$ connected via a first terminal to the ground.

The first switch $K_{i1\_HS}$; $K_{i2\_HS}$ of a measuring circuit $22_{B1}$; $22_{B2}$ comprises a terminal connected to a second terminal of the measuring resistor $R_{mes}$ or $R_{mes}'$, the first terminal of the measuring resistor $R_{mes}$ or $R_{mes}'$ being connected to the ground. The second $K_{i1\_LS}$ switch; $K_{i2\_LS}$ of a measuring circuit $22_{B1}$; $22_{B2}$ in turn comprises a terminal connected to the ground.

More specifically, with regard to the first measuring circuit $22_{B1}$:

the drain of the first transistor $K_{i1\_HS}$ is connected to the first output terminal 16 of the first transformer $10_{B1}$ connected to the first branch $B_1$ of the converter 3.

the source of the first transistor $K_{i1\_HS}$ is connected via a terminal to the second terminal of the measuring resistor $R_{mes}$ (FIG. 2) or $R_{mes}'$ (FIG. 3), the first terminal of the measuring resistor $R_{mes}$ (FIG. 2) or $R_{mes}'$ (FIG. 3), being connected to the ground, and the gate of the first transistor $K_{i1\_HS}$ is connected to the gate of the second transistor $K_{i1\_LS}$ of the first measuring circuit $22_{B1}$, the drain of the second transistor $K_{i1\_LS}$ is connected to the second output terminal 18 of the first transformer $10_{B1}$, and the source of the second transistor $K_{i1\_LS}$ is connected to the ground.

With regard to the second measuring circuit $22_{B2}$:

the drain of the first transistor $K_{i2\_HS}$ is connected to the first output terminal 16 of the second transformer $10_{B2}$ connected to the second branch $B_2$ of the converter 3.

the source of the first transistor $K_{i2\_HS}$ is connected via a terminal to the second terminal of the measuring resistor $R_{mes}$ (FIG. 2) or $R_{mes}'$ (FIG. 3), the first terminal of the measuring resistor $R_{mes}$ (FIG. 2) or $R_{mes}'$ (FIG. 3), being connected to the ground, and the gate of the first transistor $K_{i2\_HS}$ is connected to the gate of the second transistor $K_{i2\_LS}$ of the second measuring circuit $22_{B2}$, the drain of the second transistor $K_{i2\_LS}$ of the second measuring circuit $22_{B2}$ is connected to the second output terminal 18 of the second transformer $10_{B2}$, the source of the second transistor $K_{i2\_LS}$ is connected to the ground.

In addition, the first transistors $K_{i1\_HS}$ and $K_{i2\_HS}$ must be such that the voltage between the gate and the source is greater than the threshold voltage of the transistor for activating the transistor.

The transistors $K_{i1\_HS}$ and $K_{i1\_LS}$ of the first measuring circuit $22_{B1}$ and the transistors $K_{i2\_HS}$ and $K_{i2\_LS}$ of the second measuring circuit $22_{B2}$ are capable of being controlled according to the H-bridge control logic. Thus, when the primary circuit 12 of a transformer $10_{B1}$ or $10_{B2}$ is closed, the chopped current in the primary circuit 12 of the transformer $10_{B1}$ or $10_{B2}$ is non-zero, and the two transistors $K_{i1\_HS}$ and $K_{i1\_LS}$ or $K_{i2\_HS}$ and $K_{i2\_LS}$ of the associated measuring circuit $22_{B1}$ or $22_{B2}$ are in the on state. When the primary circuit 12 of the first transformer $10_{B1}$ or of the second transformer $10_{B2}$ is open, the chopped current is zero, and the two transistors $K_{i1\_HS}$ and $K_{i1\_LS}$ or $K_{i2\_HS}$ and $K_{i2\_LS}$ of the associated measuring circuit $22_{B1}$ or $22_{B2}$ are in the blocked state.

Thus, when the primary circuit 12 of a transformer $10_{B1}$ or $10_{B2}$ is closed, the chopped current $i_{Mos1}$ $i_{Mos3}$ in the primary circuit 12 of a transformer $10_{B1}$ or $10_{B2}$ being non-zero, and there is therefore a current to be measured, the two transistors $K_{i1\_HS}$ and $K_{i1\_LS}$ or $K_{i2\_HS}$ and $K_{i2\_LS}$ of the associated measuring circuit $22_{B1}$ or $22_{B2}$ must be controlled in the on state.

And, the demagnetization of a transformer $10_{B1}$ or $10_{B2}$ may be performed when the primary circuit 12 of the transformer $10_{B1}$ or $10_{B2}$ is open, the chopped current $i_{Mos1}$ or $i_{Mos3}$ being zero and there is no current to be measured, by blocking the two transistors $K_{i1\_HS}$ and $K_{i1\_LS}$ or $K_{i2\_HS}$ and $K_{i2\_LS}$ of the associated measuring circuit $22_{B1}$ or $22_{B2}$, so as to disconnect the demagnetizing circuit $20_{B1}$ or $20_{B2}$ from the measuring resistor Rmes or Rmes' during the demagnetization of the corresponding transformer $10_{B1}$ or $10_{B2}$.

When the primary circuit 12 of the first transformer $10_{B1}$ or of the second transformer $10_{B2}$ is closed, a chopped current $i_{Mos1}$ or $i_{Mos3}$ flows in the primary circuit 12 of the associated transformer $10_{B1}$ or $10_{B2}$, and a current is induced in the secondary circuit 14 of the associated transformer $10_{B1}$ or $10_{B2}$. If the transistors $K_{i1\_HS}$ and $K_{i1\_LS}$ of the first measuring circuit $22_{B1}$, respectively if the transistors $K_{i2\_HS}$ and $K_{i2\_LS}$, of the second measuring circuit $22_{B2}$, are turned on, a current $i_{mes1}$, respectively $i_{mes2}$, flows in the associated first or second measuring circuit $22_{B1}$ or $22_{B2}$.

According to a first embodiment illustrated in FIG. 2, the two measuring circuits $22_{B1}$ and $22_{B2}$ further comprise a common measuring resistor $R_{mes}$ connected firstly via a first terminal to the ground and via a second terminal to the source of the first two transistors $K_{i1\_HS}$ and $K_{i2\_HS}$. The source of the first transistor $K_{i2\_HS}$ of the unit capable of allowing or preventing the flow of a current induced by the chopped current in the first measuring circuit $22_{B1}$, is therefore connected to the source of the first transistor $K_{i2\_HS}$ of the unit capable of allowing or preventing the flow of a current induced by the chopped current in the second measuring circuit $22_{B2}$.

Thus, the currents $i_{mes1}$ and $i_{mes2}$ flowing respectively in the first measuring circuit $22_{B1}$ and in the second measuring circuit $22_{B2}$ are added together, so that the common measuring resistor $R_{mes}$ is traversed by a current $i_{mes}$, corresponding to the sum of the currents $i_{mes1}$ and $i_{mes2}$.

According to the first embodiment, the chopped current measurement is done by measuring the voltage $v_{mes}$ at the terminals of the measuring resistor $R_{mes}$. Indeed, this voltage $v_{mes}$ is an image of the chopped current $i_e$, according to formula (1):

$$v_{mes} = \frac{R_{mes}}{m_i} i_e \qquad (1)$$

where $R_{mes}$=measuring resistance common to the two measuring circuits $22_{B1}$ and $22_{B2}$, $v_{mes}$=voltage measured at the terminals of the measuring resistor $R_{mes}$, $m_i$=transformation ratio of a transformer $10_{B1}$ or $10_{B2}$.

Thus a direct measurement is obtained at the terminals of the measuring resistor $R_{mes}$ connected to the ground.

On the other hand, during the phases of demagnetization of a transformer $10_{B1}$ or $10_{B2}$, the transistors of the associated measuring circuit $22_{B1}$ or $22_{B2}$ in the blocked state enable the measuring resistor $R_{mes}$ to be decoupled from the demagnetizing circuit $20_{B1}$ or $20_{B2}$. Thus the measurement of the voltage $V_{mes}$ is not affected.

As a variant, according to a second embodiment illustrated in FIG. 3, the two measuring circuits $22_{B1}$ and $22_{B2}$ each comprise a separate measuring resistor $R_{mes}'$. The two measuring resistors $R_{mes}'$ are substantially equal in value according to the example described.

According to the second embodiment, with regard to the first measuring circuit $22_{B1}$, the measuring resistor $R_{mes}'$ is connected between the two sources of the first transistor $K_{i1\_HS}$, and of the second transistor $K_{i1\_LS}$. In addition, the source of the second transistor $K_{i1\_LS}$ is connected to the ground.

With regard to the second measuring circuit $22_{B2}$, the measuring resistor $R_{mes2}$ is connected between the two sources of the first transistor $K_{i2\_HS}$, and of the second transistor $K_{i2\_LS}$. In addition, the source of the second transistor $K_{i2\_LS}$ is connected to the ground.

Thus, the two measuring circuits $22_{B1}$; $22_{B2}$ respectively include a measuring resistor $R_{mes}'$ connected via a terminal to the ground. The measuring resistor $R_{mes}'$ of the first measuring circuit $22_{B1}$ is connected via one of the terminals thereof to the source of the first transistor $K_{i1\_HS}$, and via the other of the terminals thereof to the source of the second transistor $K_{i2\_LS}$ of the first measuring circuit $22_{B1}$. The measuring resistor $R_{mes}'$ of the second measuring circuit $22_{B2}$ is connected to the source of the first transistor $K_{i2\_HS}$ via one of the terminals thereof, and via the other of the terminals thereof to the source of the second transistor $K_{i2\_LS}$ of the second measuring circuit $22_{B2}$.

Whether it is the first embodiment in FIG. 2, or the second embodiment in FIG. 3, the common measuring resistor $R_{mes}$ or each separate measuring resistor $R_{mes}'$ of the two measuring circuits and $22_{B1}$ and $22_{B2}$ is connected to the ground. This arrangement provides better immunity with respect to noise.

According to the second embodiment, the first measuring circuit $22_{B1}$ includes a first output resistor R connected to the source of the first transistor $K_{i1\_HS}$ and to the measuring resistor $R_{mes}'$.

Similarly, the second measuring circuit $22_{B2}$ includes a second output resistor R connected to the source of the first transistor $K_{i2\_HS}$ and to the measuring resistor $R_{mes}'$. The voltage $V_{mes}$ can be measured at the common node between the two output resistors R.

In this case, these are the voltages $v_{mes1}$ and $v_{mes2}$ respectively at the terminals of the measuring resistors $R_{mes}'$ of the two measuring circuits $22_{B1}$ and $22_{B2}$ which are added together (see formula (2)):

$$v_{mes} = \frac{v_{mes1} + v_{mes2}}{2} \quad (2)$$

According to this second embodiment, the measurement of the chopped current is done by measuring the voltage $v_{mes}$ at the common node between the two output resistors R. Indeed, this voltage $v_{mes}$ is an image of the chopped current $i_e$, according to formula (3):

$$v_{mes} = \frac{1}{2} \frac{R'_{mes}}{m_i} i_e \quad (3)$$

where $R_{mes}'$=measuring resistance of each measuring circuit $22_{B1}$ and $22_{B2}$, $v_{mes}$=voltage measured at the common node between the two output resistors R, $m_i$=transformation ratio of a transformer $10_{B1}$ or $10_{B2}$.

In a similar way to the first embodiment, these measuring resistors $R_{mes}'$ are decoupled from the associated demagnetizing circuit $20_{B1}$ or $20_{B2}$ during the demagnetization period of the associated transformer $10_{B1}$ or $10_{B2}$.

Moreover, if the value of the measuring resistor of each measuring circuit $22_{B1}$ and $22_{B2}$ is substantially equal to the value of the measuring resistor $R_{mes}$ common to the two measuring circuits $22_{B1}$ and $22_{B2}$, a ratio of ½ is found in the transfer function.

In this case, if it is desired to work with the same gain for the two embodiments, the value of the resistor $R_{mes}'$ of each circuit $22_{B1}$ and $22_{B2}$ must be chosen so that it is of the order of twice the value of the common measuring resistor $R_{mes}$ according to the first embodiment, (see formula (4)):

$$R_{mes}' = 2 \times R_{mes} \quad (4)$$

The first embodiment with the measuring resistor $R_{mes}$ common to the two measuring circuits $22_{B1}$ and $22_{B2}$ provides measuring accuracy, since there are less resistors.

Furthermore, the diagram in FIG. 4 presents details of the measuring circuit $22_{B1}$ or $22_{B2}$ according to the first embodiment illustrated in FIG. 2. Of course, these additions or details also apply to the second embodiment illustrated in FIG. 3.

In the diagram in FIG. 4, it is seen that the first measuring circuit $22_{B1}$ also comprises a first resistor $R_{11}$ and a second resistor $R_{21}$ connected via a terminal common to the gates of the two transistors $K_{i1\_HS}$ and $K_{i1\_LS}$ of the measuring circuit $22_{B1}$, and secondly to a third switch $K_{i1}$. The third switch $K_{i1}$ of the first measuring circuit $22_{B1}$ is controlled by the control signal $K_2$ which also controls the second switch $Mos_2$ of the first branch $B_1$.

Similarly, the second measuring circuit $22_{B2}$ also comprises a first resistor $R_{12}$ and a second resistor $R_{22}$, connected via a common node to the gates of the two transistors $K_{i2\_HS}$ and $K_{i2\_LS}$ of the measuring circuit $22_{B2}$, and secondly to a third switch $K_{i2}$. The third switch $K_{i2}$ of the second measuring circuit $22_{B2}$ is controlled by the control signal $K_4$ which also controls the second switch $Mos_4$ of the second branch $B_2$.

The first resistor $R_{11}$ or $R_{12}$ is connected to a potential e.g. of 15 V and the second resistor $R_{21}$ or $R_{22}$ is connected to the ground.

The first and second resistors $R_{11}$ and $R_{21}$ or $R_{12}$ and $R_{22}$ ensure the correct switching of the first transistor $K_{i1\_HS}$ or $K_{i2\_HS}$ to the on state. More precisely, when the third switch $K_{i1}$ or $K_{i2}$ is blocked, the voltage $V_{G1}$, respectively $V_{G2}$, at the gates of the transistors, is positive, e.g. of the order of 10 V. The value of 10 V enables obtaining the condition according to which the voltage between the source and the gate of a first transistor $K_{i1\_HS}$ or $K_{i2\_HS}$ is greater than the threshold voltage of the transistor.

Otherwise, this voltage dependent on the values of the two resistors $R_{11}$ and $R_{21}$, respectively $R_{12}$ and $R_{22}$, is zero.

With reference to FIGS. 5 to 7, an example of control logic is described for the device 1 for measuring the chopped current according to one or other of the previously described embodiments.

Operation of the Measuring Device

Temporal Evolution of the Chopped Current

FIG. 5 represents an example of temporal evolution of the chopped currents $i_{Mos1}$ or $i_{Mos3}$ flowing in the primary circuits 12 of the transformers $10_{B1}$ et $10_{B2}$. The non-restrictive example illustrated in FIG. 5 has a high duty cycle.

On the graph in FIG. 5:

a first curve with round dots, represents the temporal evolution of the chopped current $i_{Mos1}$ in the primary circuit 12 of the first transformer $10_{B1}$ connected to the first branch $B_1$ of the converter 3, and a second curve with squares, represents the temporal evolution of the chopped current $i_{Mos3}$ in the primary circuit 12 of the second transformer $10_{B2}$ connected to the second branch $B_2$ of the converter 3.

The chopped current $i_{Mos1}$ or $i_{Mos3}$ flowing in the primary circuit 12 of a transformer $10_{B1}$ or $10_{B2}$ is periodic and is capable of taking zero values and non-zero values. When the primary circuit 12 of a transformer $10_{B1}$ or $10_{B2}$ is open, the chopped current $i_{Mos1}$ or $i_{Mos3}$ flowing in the primary circuit 12 of the transformer $10_{B1}$ or $10_{B2}$ is zero, and the corresponding transformer $10_{B1}$ or $10_{B2}$ is demagnetized.

The offset between the chopped current $i_{Mos1}$ flowing in the primary circuit 12 of the first transformer $10_{B1}$ and the chopped current $i_{Mos3}$ flowing in the primary circuit 12 of the second transformer $10_{B2}$ depends on the offset between the branches $B_1$ and $B_2$.

Control of the First Measuring Circuit $22_{B1}$

As mentioned previously, the first switch $Mos_1$ of the first branch $B_1$ is turned on when the second switch $Mos_1$ of the first branch $B_1$ is blocked, and conversely, the first switch $Mos_1$ is blocked when the second switch $Mos_1$ is turned on. In addition, according to the example of control logic illustrated in FIG. 6 or 7, a dead time $t_m$ is provided between two switchings.

The first transistor $K_{i1\_HS}$ and the second transistor $K_{i1\_LS}$ of the first measuring circuit $22_{B1}$ are controlled jointly.

The first transistor $K_{i1\_HS}$ and the second transistor $K_{i1\_LS}$ of the first measuring circuit $22_{B1}$ are turned on when the second switch $Mos_1$ of the first branch $B_1$ is blocked.

In other words, the unit $K_{i1\_HS}$, $K_{i1\_LS}$ of the first measuring circuit $22_{B1}$ configured for allowing or preventing the flow of a current induced by the chopped current $i_{Mos1}$ in the first measuring circuit $22_{B1}$, is configured for being controlled by the inverse of the control signal, termed $\overline{K_2}$ of the second switch $Mos_1$ of the first branch $B_1$. It is therefore the inverse of the control signal of the second switch $Mos_2$, termed $\overline{K_2}$, which controls the state of the transistors $K_{i1\_HS}$ and $K_{i1\_LS}$ of the first control circuit $22_{B1}$ (see FIG. 6 or 7).

Thus, when the second switch $Mos_1$ of the first branch $B_1$ is blocked, the primary circuit 12 of the first transformer $10_{B1}$ is closed, the chopped current $i_{Mos1}$ flowing in the primary circuit 12 of the first transformer $10_{B1}$ is non-zero and induces a current flowing in the secondary circuit 14 of the first transformer $10_{B1}$. Since the two transistors $K_{i1\_HS}$ and $K_{i1\_LS}$ of the first measuring circuit $22_{B1}$ are turned on, a current $i_{mes1}$ can freely flow in the measuring circuit $22_{B1}$ associated with the first transformer $10_{B1}$. On the other hand, no current flows in the demagnetizing circuit $20_{B1}$ because the second Zener diode 26 is not turned on, given that the voltage between the terminals 18 and 16 is variable and is not equal to the Zener voltage thereof.

When the second switch $Mos_1$ of the first branch $B_1$ is turned on and the first switch $Mos_1$ is blocked, the primary circuit 12 of the first transformer $10_{B1}$ is open, the chopped current $i_{Mos1}$ takes a zero value. The two transistors $K_{i1\_HS}$ and $K_{i1\_LS}$ of the first measuring circuit $22_{Bi}$ change to the blocked state, no longer allowing the flow of a current in the measuring circuit $22_{B1}$.

During this period, a demagnetizing current flows in the demagnetizing circuit $20_{B1}$, the potential difference between the terminals 18 and 16 of the secondary circuit 14 then being imposed by the Zener voltage of the second Zener diode 26 according to the example in FIGS. 2 and 3. The two transistors $K_{i1\_HS}$ and $K_{i1\_LS}$ of the first measuring circuit $22_{B1}$ in the blocked state, do not allow the flow of the demagnetizing current in the measuring circuit $22_{B1}$.

As long as the chopped current $i_{Mos1}$ is zero, the demagnetizing current decreases flowing in the demagnetizing circuit $20_{B1}$.

Control of the Second Measuring Circuit $22_{B2}$

Similarly, the first switch $Mos_3$ of the second branch $B_2$ is turned on when the second switch $Mos_4$ of the second branch $B_2$ is blocked, and conversely, the first switch $Mos_3$ is blocked when the second switch $Mos_4$ is turned on. According to the example of control logic illustrated in FIG. 6 or 7, a dead time $t_m$ is also provided between two switchings.

The first transistor $K_{i2\_HS}$ and the second transistor $K_{i2\_LS}$ of the second measuring circuit $22_{B2}$ are controlled jointly.

The first transistor $K_{i2\_HS}$ and the second transistor $K_{i2\_LS}$ of the second measuring circuit $22_{B2}$ are turned on when the second switch $Mos_4$ of the second branch $B_2$ is blocked.

The unit $K_{i2\_HS}$, $K_{i2\_LS}$ of the second measuring circuit $22_{B2}$ configured for allowing or preventing the flow of a current induced by the chopped current $i_{Mos3}$ in the second measuring circuit $22_{B2}$ is configured for being controlled by the inverse of the control signal, termed $\overline{K_4}$ of the second switch $Mos_4$ of the second branch $B_2$.

It is therefore the inverse of the control signal of the second switch $Mos_4$, termed $\overline{K_4}$, which controls the state of the transistors $K_{i2\_HS}$ and $K_{i2\_LS}$ of the second measuring circuit $22_{B2}$ (see FIG. 6 or 7).

Thus, when the second switch $Mos_4$ of the second branch $B_2$ is blocked, the primary circuit 12 of the second transformer $10_{B2}$ is closed, the chopped current $i_{Mos3}$ flowing in the primary circuit 12 of the second transformer $10_{B2}$ is non-zero and induces a current flowing in the secondary circuit 14 of the second transformer $10_{B2}$. Since the two transistors $K_{i2\_HS}$ and $K_{i2\_LS}$ of the second measuring circuit $22_{B2}$ are turned on, a current $i_{mes2}$ can freely flow in the measuring circuit $22_{B2}$ associated with the second transformer $10_{B2}$. On the other hand, no current flows in the demagnetizing circuit $20_{B2}$ because the second Zener diode 26 is not turned on, given that the voltage between the terminals 18 and 16 is variable and is not equal to the Zener voltage thereof.

As soon as the second switch $Mos_4$ of the second branch $B_2$ is turned on and the first switch $Mos_3$ is blocked, the primary circuit 12 of the second transformer $10_{B2}$ is open, the chopped current $i_{Mos3}$ takes a zero value. The two transistors $K_{i2\_HS}$ and $K_{i2\_LS}$ of the second measuring circuit $22_{B2}$ change to the blocked state, no longer allowing the flow of a current in the measuring circuit $22_{B2}$.

However, during this period, a demagnetizing current flows in the demagnetizing circuit $20_{B2}$, according to the example illustrated in FIGS. 2 and 3, the potential difference between the terminals 18 and 16 of the secondary circuit 14 then being imposed by the Zener voltage of the second Zener diode 26. As long as the chopped current $i_{Mos3}$ is zero, the demagnetizing current decreases flowing in the demagnetizing circuit $20_{B2}$. The two transistors $K_{i2\_HS}$ and $K_{i2\_LS}$ of the second measuring circuit $22_{B2}$ in the blocked state, do not allow the flow of the demagnetizing current in the measuring circuit $22_{B2}$.

Thus over a period T of operation, there is always a half period when the chopped current is zero, so that the demagnetization time is constant and ensures the demagnetization of the transformers $10_{B1}$ and $10_{B2}$. Demagnetization is therefore independent of the duty cycle.

Thus, whatever the direction of the demagnetizing current, when the primary circuit 12 of the transformer $10_{B1}$ or $10_{B2}$ is open, the chopped current $i_{Mos1}$ or $i_{Mos3}$ takes the value zero, the device 1 enables the demagnetization of the associated transformer $10_{B1}$ or $10_{B2}$. In other words, given that the direction of the magnetizing current depends on the average value of the chopped current $i_{Mos1}$ or $i_{Mos3}$, whatever the average value of the chopped current $i_{Mos1}$ or $i_{Mos3}$, the device 1 enables the demagnetization of the associated transformer $10_{B1}$ or $10_{B2}$.

With regard to the measurement of the chopped current, this is accomplished by measuring the voltage $v_{mes}$ at the terminals of the measuring resistor $R_{mes}$ according to the first embodiment illustrated in FIG. 2 or 4, or by measuring the voltage $v_{mes}$ at the common node between the output resistors R of the two measuring circuits $22_{B1}$ and $22_{B2}$ according to the second embodiment illustrated in FIG. 3, the voltage $v_{mes}$ being proportional to the chopped current $i_e$, according to formula (1) for the first embodiment or according to formula (3) for the second embodiment.

Referring to FIG. 8, this measurement of the voltage $v_{mes}$ measured, for example, at the terminals of the measuring resistor $R_{mes}$, provides information on the average value of the input current $i_e$ absorbed by the converter 3, e.g. by means of a double RC filter for obtaining the voltage $V_{IE}$ corresponding to the average value of the voltage $V_{mes}$.

In addition, it may be desired to monitor the peak value of the instantaneous current $i_e$. Two comparators may be provided for this purpose. The first comparator being, for example, provided for limiting the current, and the second comparator for fault detection.

The invention claimed is:

1. A device for measuring a chopped current capable of flowing in a circuit having an H-bridge structure including a first branch and a second branch, the device comprising:
two transformers respectively connected to a branch of the H-bridge, the transformers respectively comprising a primary circuit configured for the flow of a chopped current, and a secondary circuit;
two circuits for demagnetizing the two transformers; and
two measuring circuits respectively connected to the terminals of the secondary circuit of an associated transformer, the measuring circuits respectively including at least one unit which comprises a first switch and a second switch connected in reverse, the two switches being respectively implemented by a transistor and being capable of being controlled so as to:
allow the flow of the current induced by the chopped current, in the measuring circuit when the primary circuit of an associated transformer is closed, and
prevent the flow of the demagnetizing current in the measuring circuit when the primary circuit of an associated transformer is open;
the measuring circuits including a common measuring resistor connected via a first terminal to the ground, and via a second terminal to the source of the first transistor of the first measuring circuit and to the source of the first transistor of the second measuring circuit.

2. The device according to claim 1, in which the first switch and the second switch are respectively implemented by a field effect transistor.

3. The device according to claim 1, wherein:
the first switch of a measuring circuit comprises a terminal connected to a second terminal of the measuring resistor, the first terminal of the measuring resistor being connected to the ground; and
the second switch of a measuring circuit comprises a terminal connected to the ground.

4. The device according to claim 1, wherein:
the branches of the circuit respectively include a first switch and a second switch,
the first transformer is connected to the first switch of the first branch and the second transformer is connected to the first switch of the second branch, and
the unit of the first measuring circuit configured for allowing or preventing the flow of a current induced by the chopped current in the first measuring circuit, is configured for being controlled by the inverse of the control signal of the second switch of the first branch and
the unit of the second measuring circuit configured for allowing or preventing the flow of a current induced by the chopped current in the second measuring circuit is configured for being controlled by the inverse of the control signal of the second switch of the second branch.

5. The device according to claim 1, wherein:
the first measuring circuit comprises a first resistor and a second resistor, the terminal common to the two resistors being connected to the gate of the first transistor and of the second transistor of the first measuring circuit, and
the second measuring circuit comprises a first resistor and a second resistor, the terminal common to the two resistors being connected to the gate of the first transistor and of the second transistor of the second measuring circuit.

6. The device according to claim 1, wherein a demagnetizing circuit is connected between the two output terminals of the secondary circuit of the associated transformer.

7. The device according to claim 6, in which a demagnetizing circuit comprises two Zener diodes mounted in series and in opposite directions.

* * * * *